(12) United States Patent
Dyszel

(10) Patent No.: US 9,939,468 B1
(45) Date of Patent: Apr. 10, 2018

(54) WEARABLE NON CONTACTING AC VOLTAGE DETECTION SYSTEM

(71) Applicant: Michael Joseph Dyszel, Pottstown, PA (US)

(72) Inventor: Michael Joseph Dyszel, Pottstown, PA (US)

(73) Assignee: Michael J. Dyszel, Pottstown, PA (US)

( * ) Notice: Subject to any disclaimer, the term of this patent is extended or adjusted under 35 U.S.C. 154(b) by 0 days.

(21) Appl. No.: 15/587,401

(22) Filed: May 5, 2017

(51) Int. Cl.
*G01R 19/155* (2006.01)
*H01B 17/56* (2006.01)
*G08B 21/02* (2006.01)
*A41D 19/015* (2006.01)
*A41D 19/00* (2006.01)

(52) U.S. Cl.
CPC ......... *G01R 19/155* (2013.01); *A41D 19/001* (2013.01); *A41D 19/01594* (2013.01); *G08B 21/02* (2013.01); *H01B 17/56* (2013.01)

(58) Field of Classification Search
CPC ........ G08B 21/02; G01R 1/07; G01R 19/155; G01R 19/145; A41D 19/0027; A41D 19/0031; A41D 19/01594; A61N 1/0456
USPC ..... 340/660, 686.5, 551, 635; 2/16; 324/222
See application file for complete search history.

(56) References Cited

U.S. PATENT DOCUMENTS

| 8,882,285 B2 | 11/2014 | Walsh |
| 8,994,361 B2 | 3/2015 | Nuzzo |
| 2005/0104735 A1* | 5/2005 | Luebke ............. G01R 1/06788 340/686.5 |
| 2007/0118945 A1* | 5/2007 | Hoffman ............. A61N 1/0456 2/16 |
| 2011/0234414 A1* | 9/2011 | Ojeda ................... G08B 21/02 340/635 |
| 2015/0233779 A1* | 8/2015 | Chen ...................... G01P 15/00 702/139 |
| 2016/0025682 A1* | 1/2016 | Walker ................ G01N 27/904 324/222 |
| 2016/0209448 A1* | 7/2016 | Currie .................... G08B 21/02 |
| 2016/0209884 A1 | 7/2016 | Currie |
| 2017/0099888 A1* | 4/2017 | Flynn ................ A41D 19/0027 |

FOREIGN PATENT DOCUMENTS

NZ             622863        10/2015

* cited by examiner

*Primary Examiner* — George Bugg
*Assistant Examiner* — Munear Akki

(57) ABSTRACT

A shock resistant, non contacting alternating current (AC) sensing device intended to be worn on the hands in the formation of protective gloves. Alerting user of AC voltage potential when approaching energized equipment, protects the user's palms and fingertips from energized components. The glove encompasses non contacting AC voltage potential sensing circuitry, electrically receptive antenna throughout anterior hand surfaces, layer intended to protect the user and antenna from electrical contact. As the user's hands approach an electrically energized apparatus of equipment, the antenna will receive signaling transponding to the logic board, which will then energize a notification appliance alerting the user of danger.

15 Claims, 5 Drawing Sheets

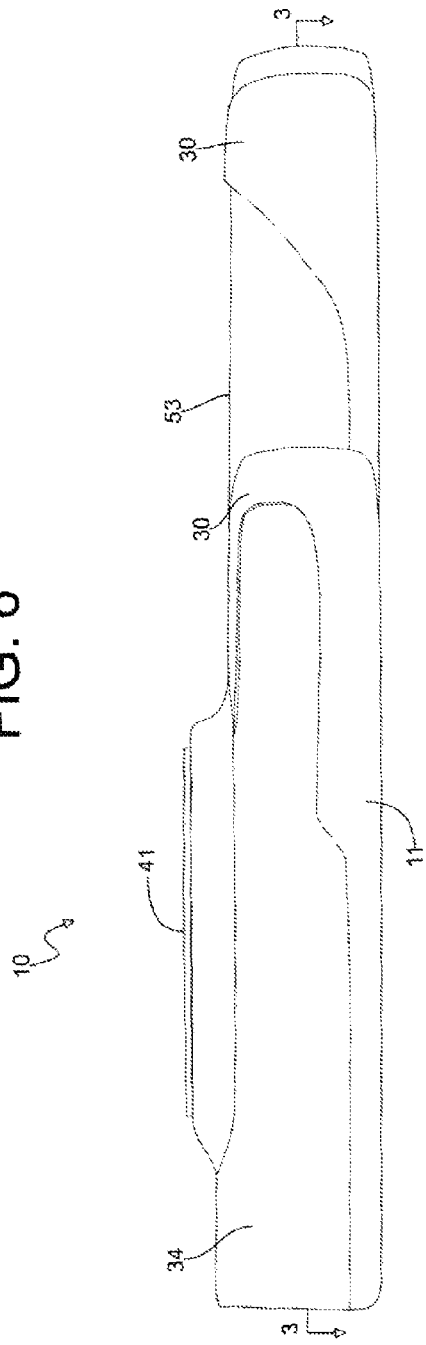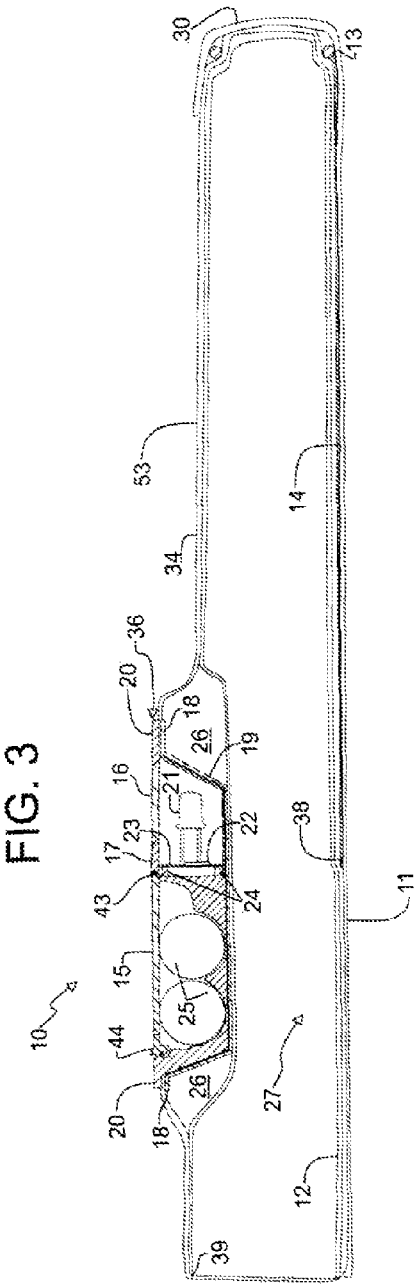

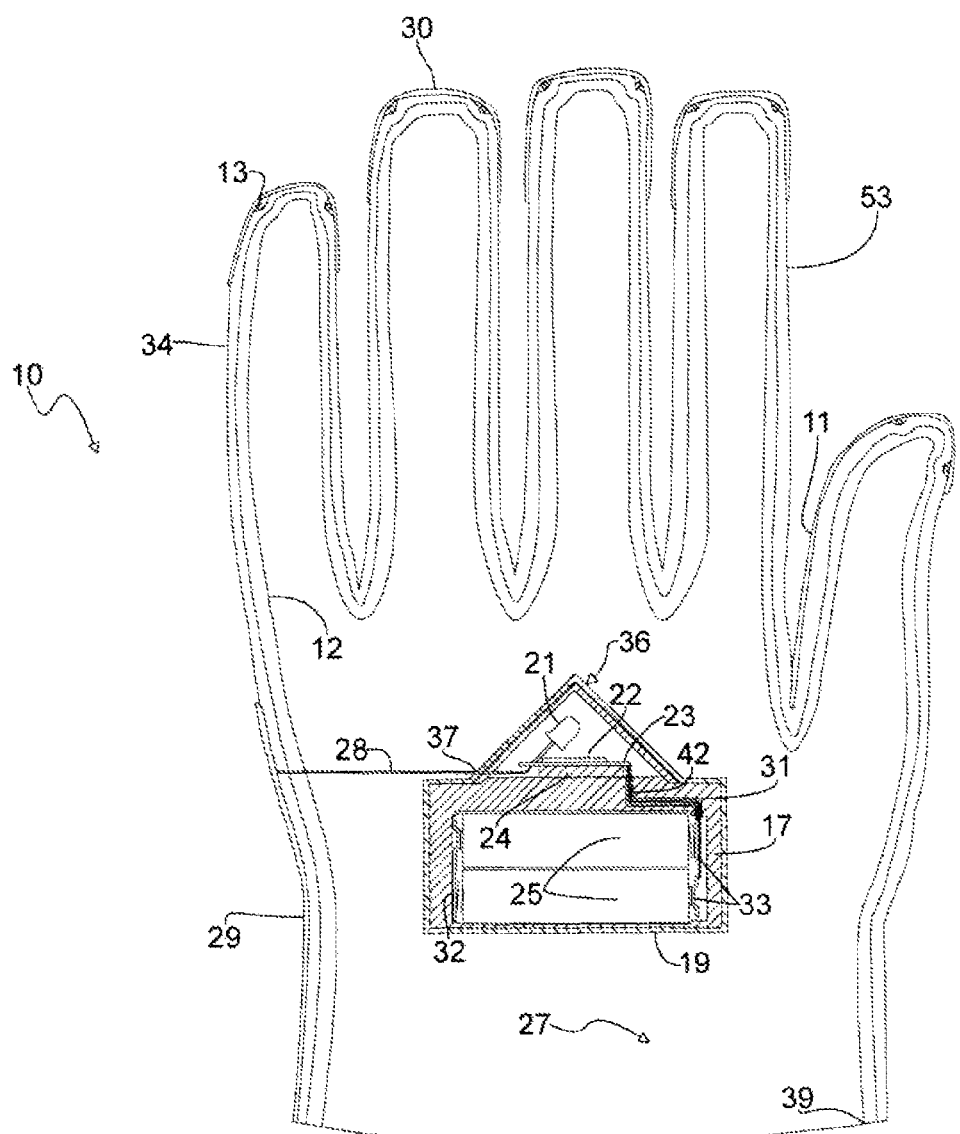

WEARABLE NON CONTACTING AC VOLTAGE DETECTION SYSTEM

FIELD OF INVENTION

The present invention relates to non contacting voltage detection systems, and in more particularly with wearable non contacting voltage detection systems in which can be worn by the user to notify the user when voltage presence is detected.

BACKGROUND OF INVENTION

Non contacting AC voltage potential sensing technology is a well known system that has been used for years. There are many different variations of devices that use non contact detection methods, most of which are utilized in the form of a handheld pen style tester. Prior art further teaches of various forms of non contacting voltage detection integrated into or onto glove or wearable bodies, as observed in the prior art, all prior inventions fail to provide sensory means within the palm of the glove. Further prior inventions fail to teach of any protection to the receptive antenna or the user from contact with energized electrical components. Additionally, prior art does not disclose receptive antenna located throughout a plurality of anterior phalanges, to provide concurrent protection to a plurality of distal ends. Therefor an improved design is required, improved design described in the following summary.

SUMMARY OF INVENTION

The present invention teaches of critical improvements to prior designs of wearable electrical testing apparatuses, in which give rise to the improvements described below.

The present invention provides a shock resistant non contact AC voltage potential sensing device intended to be worn on the hands in the formation of protective gloves. The system comprises a protective glove body encompassing a protective material, a padded interior material; an electrically insulative layer in which encloses receptive antenna network and users hands; battery supply operably connected to non contacting sensory circuitry; non contacting voltage sensing circuitry operably connected to antenna network; antenna network located throughout anterior hand and distal ends; device for notifying user of the presence of AC voltage.

The present invention is to provide means for a glove utilizing non contact sensing AC voltage potential in a safe, efficient, low cost method not taught by prior art, by utilizing non contacting voltage sensing circuitry, located near the anterior hand surface. In which does not come in electrical connection with live electrical equipment. In which anterior hand surface may often approach energized electrical equipment.

Also the present invention is to provide a means for a glove utilizing non contact sensing AC voltage potential to provide sensing capabilities to the anterior palm and a plurality of anterior distal ends. Including receptive antenna near the anterior hand surface and a plurality of anterior phalanges, will allow notification to the user from multiple locations within the apparatus. Further receptive antenna located near the anterior hand will provide efficient detection of AC voltage potential, without needing to utilize high sensitivity non contacting voltage potential circuitry, which may provide false signals to the user.

Further the present invention is to provide means for a glove utilizing non contact sensing AC voltage potential wherein an electrically insulative layer provides protection to antenna and user concurrently, as the presented invention is at risk to come into contact with energized electrical equipment. Additionally electrically insulative layer will provide protection from lacerations and abrasions to palm and distal ends from sharp metal pieces within energized electrical equipment.

Other advantages and features will manifest from the following detailed description, accompanied by drawings in which illustrate principles of the invention.

DRAWINGS

FIG. 3 is a longitudinal cross section of line 2-2 of FIG. 1 of the present invention.

FIG. 5 is a latitudinal midpoint cross section of line 3-3 of FIG. 6 of the present invention.

FIG. 6 is a side view of the present invention.

DETAILED DESCRIPTION

Utilized in the detailed description, the nomenclature expressed above, such as "a" and "an" are defined to include at least one or more of the described components, unless stated otherwise. Detailed description accompanied by illustration figures are to be offered of way of example, and not a limitation in any way, except set forth in the following claims.

Figure 1:
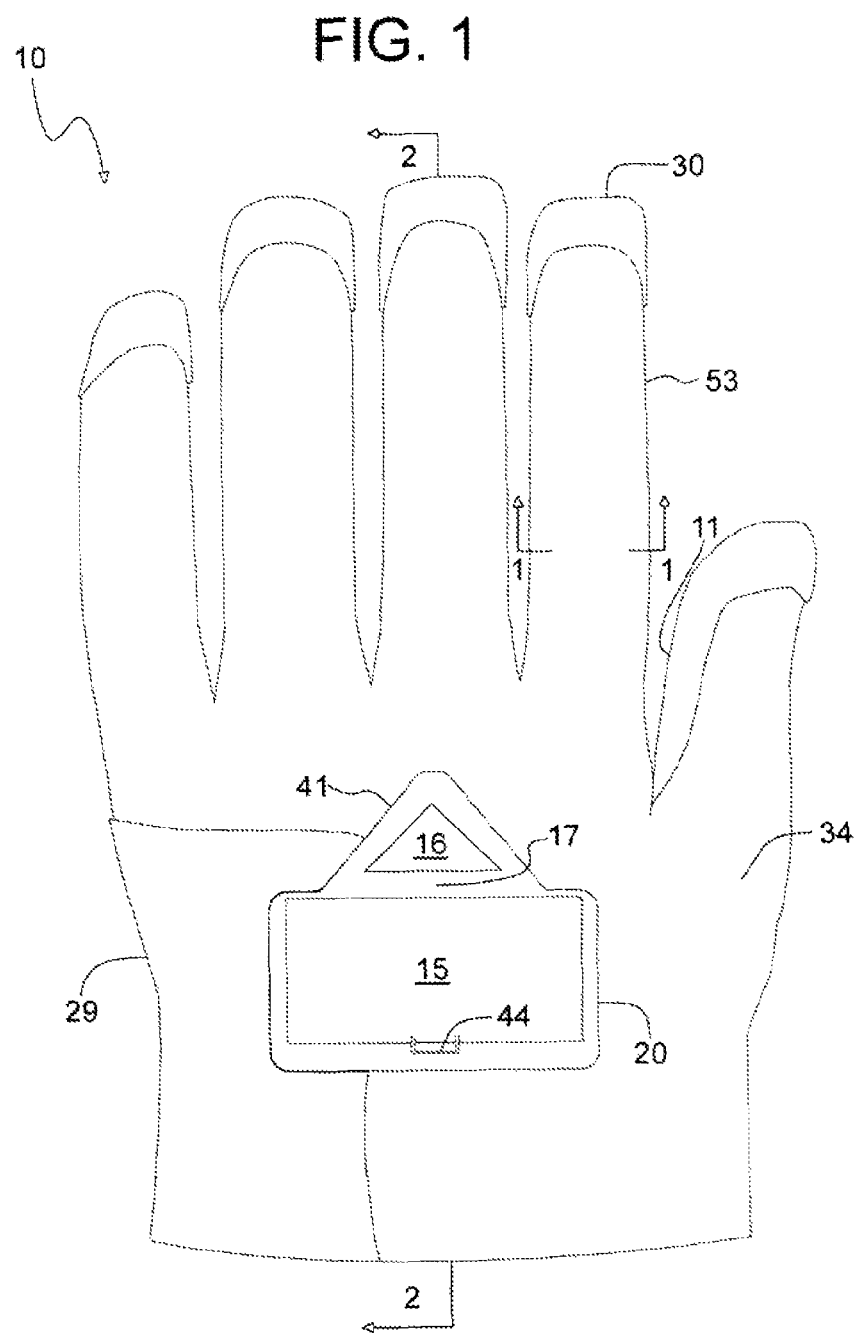
FIG. 1 is a top view of a shock resistant non contact AC voltage sensing glove constructed in accordance to the first embodiment of the present invention.

Referring to the drawings, and in particular to FIG. 1 a first embodiment of the present invention, a shock resistant non contact AC voltage potential sensing device intended to be worn on the hands in the formation of protective gloves, shown at 10. The AC voltage detecting glove 10 as observed by the user, comprises of a layer constructed of an electrically insulative membrane 11, such as flexible PVC or rubber like material, in which is electrically engineered to withstand a designated voltage, covering a durable wear resistant exterior material 34 such as nylon or DuPont™ Kevlar®. Durable exterior 34 may have an exterior interface of injection molded plastic 41 protruding through durable exterior 34, to alert user of AC voltage potential through translucent cover 16, and allowing of installation of battery supply 25. The interior system FIG. 3 of the apparatus additionally housing sensory means of distal antenna 13, and network of receptive antenna located near the posterior phalanges 14, adhered in conjuncture with a palm located antenna 38. Antenna network 40 located between exterior material 34 and electrically insulative membrane 11, furthermore antenna network 40 consisting of high conductivity, low resistance, high flexibility wire. Assembly in this method will allow protection to the user from an electrical injury and physical injury from trauma, concurrently allocating electrical protection to receptive antenna 14. Assembly further in method will allow for efficient detection of AC voltage potential. Shown in FIG. 1 electrically insulative membrane extension 29, overlapping onto the posterior hand contiguous with exterior injection molded plastic 17, to protect extending antenna 28. Extending antenna 28 may passthrough exterior material 34 at the rise of expansion cavity 26, to connect to assembly housing 36. Exterior perforation 35 in exterior material 34 and insulative membrane extension 29, allows for exterior injection molded plastic or plastic like material 17 to protrude through exterior material 34 to be bonded with permanent adhesive to interior injection molded plastic or plastic like material 19. Assembly housing 36 fastened to exterior material 34 by way of a conjoined ledge 18 of said interior injection molded plastic 19 and exterior conjoined ledge 20 of exterior injection molded plastic 17. Exterior material 34 may be additionally bonded between the perforation 35 by means of permanent adhesive applied to the bottom of exterior conjoined ledge 18 and top of interior conjoined ledge 20, to create a permanent fixture to exterior material 34. Assembly in this manner will allow for a commensurate size of electrically insulative membrane 11, in which can encompass the entirety of the exterior material 34 to protect from higher voltages.

Viewed in FIG. 5 extending antenna 28 travels through antenna passage 37 through exterior injection molded plastic 17 and interior injection molded plastic 19 allowing extending antenna 28 to be connected to circuit board 23. As distal antenna 13, shown in FIG. 3 approach electrically charged equipment, detection of a magnetic field will register within the circuit board 23, thus fourteen pin hex Schmitt style integrated circuit (IC) 22 will supply current to activate a visual alarm light emitting diode (LED) 21. A visual alarm such as an LED 21 is used for an obvious indication of detected AC voltage presence, without being a distraction to the user.

As illustrated in FIGS. 2,3,4 and 5, a soft padding interior material 12 which may be manufactured from polyethylene terephthalate or flannel material, used to comfort the hands of the user. Further illustrated in FIG. 3, interior material 12 installed in conjuncture with exterior material 34 and control assembly 36, will manifest an expansion cavity 26 allowing for control assembly 36 to advance in position to allow a commensurate fit for varying hand sizes of users. Exterior material 34 and interior material may be attached at hand cavity seam 39. Interior material 12 further utilized to protect the wearer from discomfort or irritation from control assembly 36.

Figure 2:
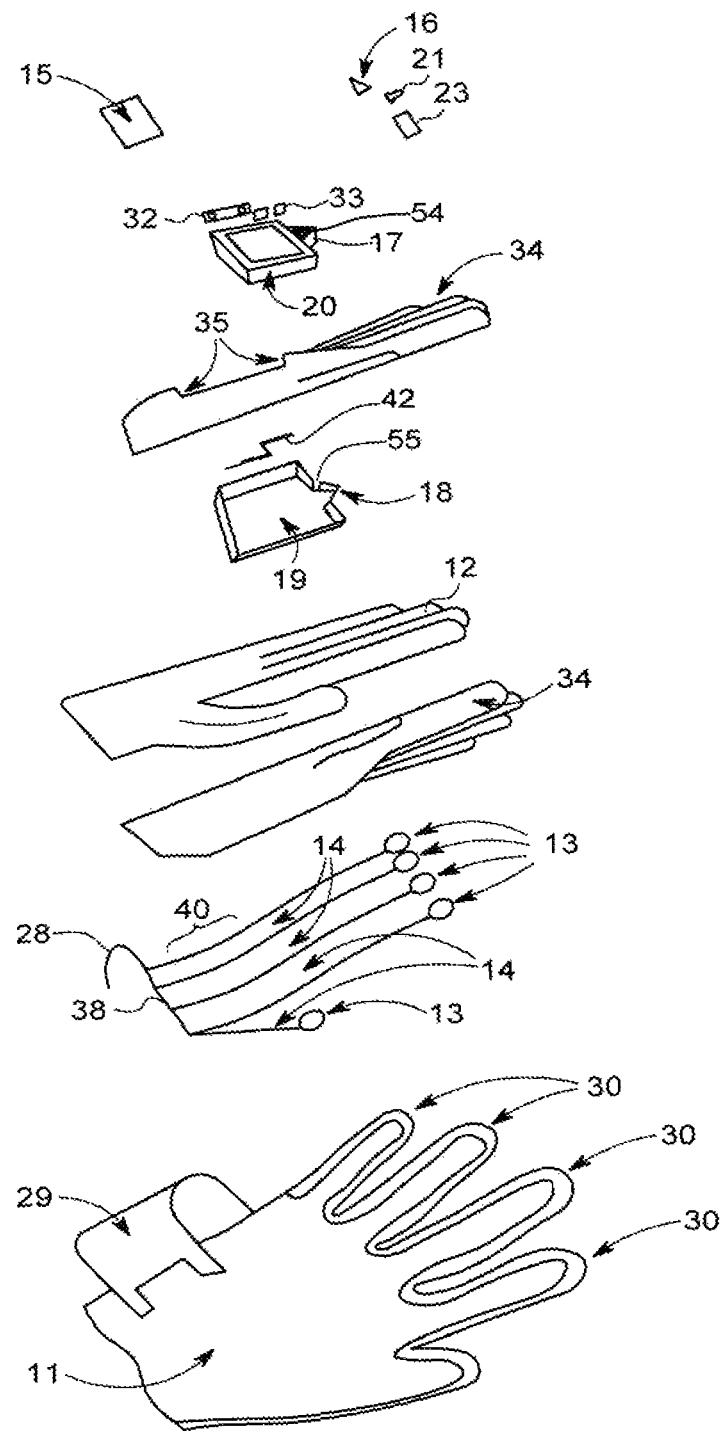
FIG. 2 is an exploded view of the present invention.

Manufacturing process, illustrated in FIG. 2, exterior material 34 layer of glove with exterior perforation 35 may first be fastened to antenna network 40. Antenna network 40 comprising distal antenna 13, distal antenna 13 shall register onto the distal ends 53 of exterior material 34 glove. Distal antenna 14 will locate to the center of the posterior phalanges, attaching centripetally to the palm located antenna 38. Extending antenna 28 extending from palm located antenna 38, extending antenna 28 may be routed along exterior material 34 of glove, oppositely of thumb located antenna. Extending antenna 28 may pass through exterior material 34 at antenna passage 37. Assembly housing 36 comprising exterior injection molded plastic 17 and interior injection molded plastic 19, bonded together using permanent adhesive, interior injection molded plastic 19 may be compressed against exterior injection 17 molded plastic, conjoined ledges 18 and 20. Contact will permeate exterior material 34 immediately near exterior perforation 35, manifesting a durable long lasting exterior. Extending antenna 28 may pass through a formed notch 54 in exterior injection molded plastic 17 and an equally opposite notch 55 in interior injection molded plastic 19, sealed with permanent adhesive during compression of interior injection molded plastic 19 and exterior injection molded plastic 17. Electrically insulative membrane 11, comprising sturdy distal end protection 30 and electrically insulative membrane extension 29, may be fastened to exterior material 34 and antenna network 40, with flexible permanent adhesive. interior material inserted into glove assembly 10 and sewn at hand cavity seam 39.

Figure 7:
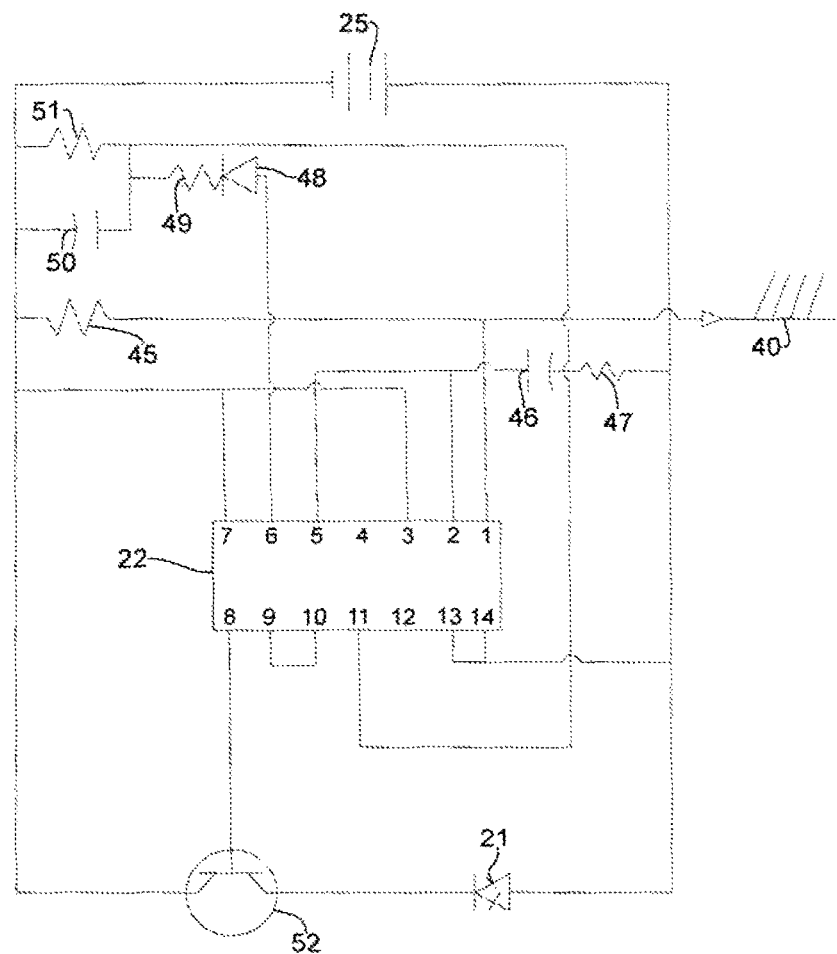
FIG. 7 is a circuit schematic encompassed by the present invention.
Figure 4:
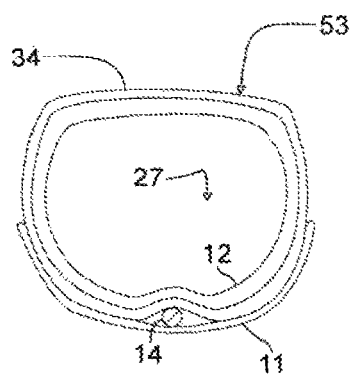
FIG. 4 is a latitudinal cross section of line 1-1 of FIG. 1 of the present invention.

As illustrated in FIGS. 2,3 and 5, distal antenna 13 connected to anterior phalange antenna 14, may be connected electrically using high conductivity low resistance soldering. Further, receptive antenna located near posterior phalanges 14 will then be connected to palm located central antenna 38 using high conductivity low resistance soldering. Distal antenna 13 to be comprised of a sturdy, low resistance high conductivity material, in which will register to exterior material 34, further simplifying method of manufacture. Palm located antenna 38 may extend from thumb located distal antenna 13 to high conductivity low resistance soldering point on circuit board 23. Antenna network 40 may be positioned between the exterior material 34 and insulative membrane 11. Assembly in this manner will protect the user from an injury from an electrical shock, in addition the antenna network 40 will be protected from contact with charged electrical equipment, further protecting the user. Circuit board 23 may comprise hex Schmitt trigger style fourteen pin IC 22 and illuminating LED 21, the circuit board 23 connected to assembly housing 36 utilizing support tabs 24. Circuit board 23 consists of non contacting electrical sensory circuitry. When antenna network 40 approaches an electrical field a voltage in induced in antenna network 40. Referring to FIG. 7 antenna network connected to pin 1 of IC 22, and an opposing connection to a resistor 45 with a resistance of 330 milliohms due negative. In which when induced voltage is a applied, approximately zero volts will be emitted from pin 2 of IC 22. Therefor facilitating capacitor 46 to discharge, capacitor 46 receives charge by resistor 47. After discharge of capacitor 45 a voltage near zero manifests close to pin 5 of IC 22, thus forth a square wave voltage of approximately 3.0 volts will be emitted from pin 6 from the IC 22. System thereof eliminating square wave form on 3.0 volts comprises of a diode 48 placed in series with a resistor 49, series with a capacitor 50 and resistor 51 placed in parallel. After discharge of capacitor 50 oscillating square sinusoidal wave will be a semi rectified voltage of 1.3 to 1.7 volts. Semi rectified voltage applied to pin 11 on IC 22, the IC 22 will emit a near zero voltage on pin 10, in which is electrically connected to pin 9 of said IC 22. IC 22 will then discharge a voltage approximately of 3.0 volts derived from pin 8 of the IC 22, pin 6 connected transistor 52, which will then actuate illuminating LED 21. According to FIG. 3, LED 21 connected to circuit board 23 may be enclosed within control assembly 36, viewable from exterior by translucent cover 16. Translucent cover 16 attached to injection molded plastic 17 utilizing permanent adhesive, to create a durable, long lasting fixture. Shown in FIG. 5, circuit board 23 powered by battery supply 25, by way of circuit track 32. Circuit track 32 consists of a tubular or rectangular cavity in injection molded plastic, circuit track 32 comprises of a notch formed in exterior injection molded plastic 17, enclosed by interior injection molded plastic 19. Circuit track 32 designed to allow power supplying wires 42 to connect to circuit board 23.

Depicted in FIG. 5 battery supply 25 should preferably consist of two AAA batteries installed in series, aided by battery connector 32. Battery connector 32 comprises of an embossed member for receiving positive 1.5 volts and a spring compressed against negative member of the second battery. Combined power in volts after battery supply put in series equals 3 volts. 3 volt power supply is received by power receiving connectors 34, separated members consisting of an embossed member opposed to a spring compressing member. Power receiving connectors 34, soldered to power supplying wires 42, to supply a 3 volt supply to circuit board 23. Visualized in FIGS. 1,2, and 3 battery door 15 connected distally to the user to exterior Injected molded plastic 17, utilizing battery door tabs 43. Battery door 15 connected proximally to the user to exterior injection molded plastic 17 by way of a battery door latch 44. Battery supply 25 constrained in place by battery door 15, battery door 15 removable to provide access to remove and or replace battery supply 25.

User may place their hands into the pair of gloves utilizing hand cavity 27, ensuring that a operable battery supply 25 is installed correctly. User may further act in good practice to test the glove 10 on known live circuits. During the course of use, as glove 10 approaches live electrical equipment, said equipment will induce a voltage in antenna network 40, from either distal antenna 13, posterior phalange antenna 14, or palm antenna 38. Induced voltage may travel through extending antenna 28 to circuit board 22, in which will illuminate LED 21, alerting user of danger in an obvious and non distracting way.

What is claimed is:

1. A shock resistant non contact AC voltage potential sensing system adapted to be worn on the hands, the apparatus comprising:
    a glove body to be worn on hands;
    a battery supply operably connected to AC voltage sensing circuit;
    battery operated non contact AC voltage sensing circuit located within said apparatus connected to receptive antenna;
    anterior palm located antenna extending distally to anterior fingers surfaces, to provide receptive means to entirety of anterior hand surface;
    notification device featured within apparatus to alert user when AC voltage potential is near the anterior palm located antenna, which is operably connected to AC voltage sensing circuit;
    electrically insulative layer protecting user and antenna from contact with energized equipment.

2. The non contact AC voltage potential sensing system as defined in claim 1, wherein notification device located on the back of the hand.

3. The non contact AC voltage potential sensing system as defined in claim 1, wherein notification device comprises an light emitting diode.

4. The non contact AC voltage potential sensing system defined in claim 1, wherein receptive antenna completely covered by insulative layer.

5. The non contact AC voltage potential sensing system as defined in claim 1, wherein electrically insulative layer comprises a plurality of protective pliant distal ends.

6. An electrically insulative garment anticipated to be worn on the hands, alerting users of the presence of AC voltage potential utilizing non contacting circuitry detection, apparatus comprising:
    a glove body to be worn on hands;
    a battery supply operably connected to AC voltage sensing circuit;
    battery operated non contact AC voltage sensing circuit located within said apparatus connected to receptive antenna;
    anterior palm located antenna extending distally to anterior fingers surfaces, to provide receptive means to entirety of anterior hand surface;
    notification device featured within apparatus to alert user when AC voltage potential is near the anterior palm located antenna, which is operably connected to AC voltage sensing circuit;
    electrically insulative layer protecting user and antenna from contact with energized equipment.

7. The electrically insulative garment, as defined in claim 6, wherein visual notification device located on the posterior hand.

8. The electrically insulative garment, as defined in claim 6, wherein notification device comprises an light emitting diode.

9. The electrically insulative garment, as defined in claim 6, wherein receptive antenna completely covered by insulative layer.

10. The electrically insulative garment, as defined in claim 6, wherein electrically insulative layer comprises a plurality of protective pliant distal ends.

11. A non contacting alternating current sensing apparatus intended to be worn on the hands in the formation of protective gloves, apparatus comprising:
    a glove body to be worn on hands;
    a battery supply operably connected to AC voltage sensing circuit;
    battery operated non contact AC voltage sensing circuit located within said apparatus connected to receptive antenna;
    anterior palm located antenna extending distally to anterior fingers surfaces, to provide receptive means to entirety of anterior hand surface;
    notification device featured within apparatus to alert user when AC voltage potential presence, is near the anterior palm located antenna, which is operably connected to AC voltage sensing circuit;
    electrically insulative layer protecting user and antenna from contact with energized equipment.

12. The non contacting alternating current sensing apparatus intended to be worn on the hands in the formation of protective gloves, as defined in claim 11, wherein notification device located on the back of the hand.

13. The non contacting alternating current sensing apparatus intended to be worn on the hands in the formation of protective gloves, as defined in claim 11, wherein notification device comprises an light emitting diode.

14. The non contacting alternating current sensing apparatus intended to be worn on the hands in the formation of protective gloves, as defined in claim 11, wherein receptive antenna completely covered by insulative layer.

15. The non contacting alternating current sensing apparatus intended to be worn on the hands in the formation of protective gloves, as defined in claim 11, wherein electrically insulative layer comprises a plurality of protective pliant distal ends.

* * * * *